US006765816B2

(12) United States Patent
Pelley

(10) Patent No.: US 6,765,816 B2
(45) Date of Patent: Jul. 20, 2004

(54) STORAGE CIRCUIT HAVING SINGLE-ENDED WRITE CIRCUITRY

(75) Inventor: Perry H. Pelley, Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/290,704

(22) Filed: Nov. 8, 2002

(65) Prior Publication Data
US 2004/0090819 A1 May 13, 2004

(51) Int. Cl.[7] .............................................. G11C 11/00
(52) U.S. Cl. ...................................... 365/154; 365/156
(58) Field of Search ................................. 365/154, 156, 365/49, 63, 205, 207, 230.05

(56) References Cited

U.S. PATENT DOCUMENTS 5,742,557 A * 4/1998 Gibbins et al. ........ 365/230.05
6,005,794 A * 12/1999 Sheffield et al. ............ 365/154
6,208,565 B1 * 3/2001 Riedlinger et al. ..... 365/230.05
6,288,969 B1 * 9/2001 Gibbins et al. ........ 365/230.05

* cited by examiner

Primary Examiner—Gene N. Auduong
(74) Attorney, Agent, or Firm—Susan C. Hill

(57) ABSTRACT

Single-ended write circuitry (18) in storage circuit (19) includes transistor (35) which provides aid in transitioning latch node (51) from a logic state "1" to a logic state "0" when latch node (50) is being transitioned from a logic state "0" to a logic state "1". Similarly, single-ended write circuitry (18) includes transistor (37) which provides aid in transitioning latch node (50) from a logic state "1" to a logic state "0" when latch node (51) is being transitioned from a logic state "0" to a logic state "1". In some embodiments of the present invention, the effect of transistor (35) may be selectively applied to latch (16). A device, such as transistor (34), may be used to selectively negate the effect of transistor (35). In some embodiments of the present invention, the effect of transistor (37) may be selectively applied to latch (16). A device, such as transistor (36), may be used to selectively negate the effect of transistor (37).

23 Claims, 2 Drawing Sheets

US 6,765,816 B2

STORAGE CIRCUIT HAVING SINGLE-ENDED WRITE CIRCUITRY

FIELD OF THE INVENTION

The invention relates generally to circuits, and more particularly, to a storage circuit having single-ended write circuitry.

BACKGROUND OF THE INVENTION

In integrated circuits technology there is a continuing desire to reduce the physical area required to implement devices (e.g. transistors) in order to integrate more devices on a single integrated circuit and to reduce the cost of integrated circuits. However, as the physical dimensions of devices used within integrated circuits are reduced, some of the circuits begin to fail due to the newly reduced dimensions. The cause of the circuit failures varies depending upon the particular circuit.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

Although the invention has been described with respect to specific conductivity types or polarity of potentials, skilled artisans appreciated that conductivity types and polarities of potentials may be reversed. Thus n-channel and p-channel devices may be selectively replaced with complementary devices.

Figure 2:
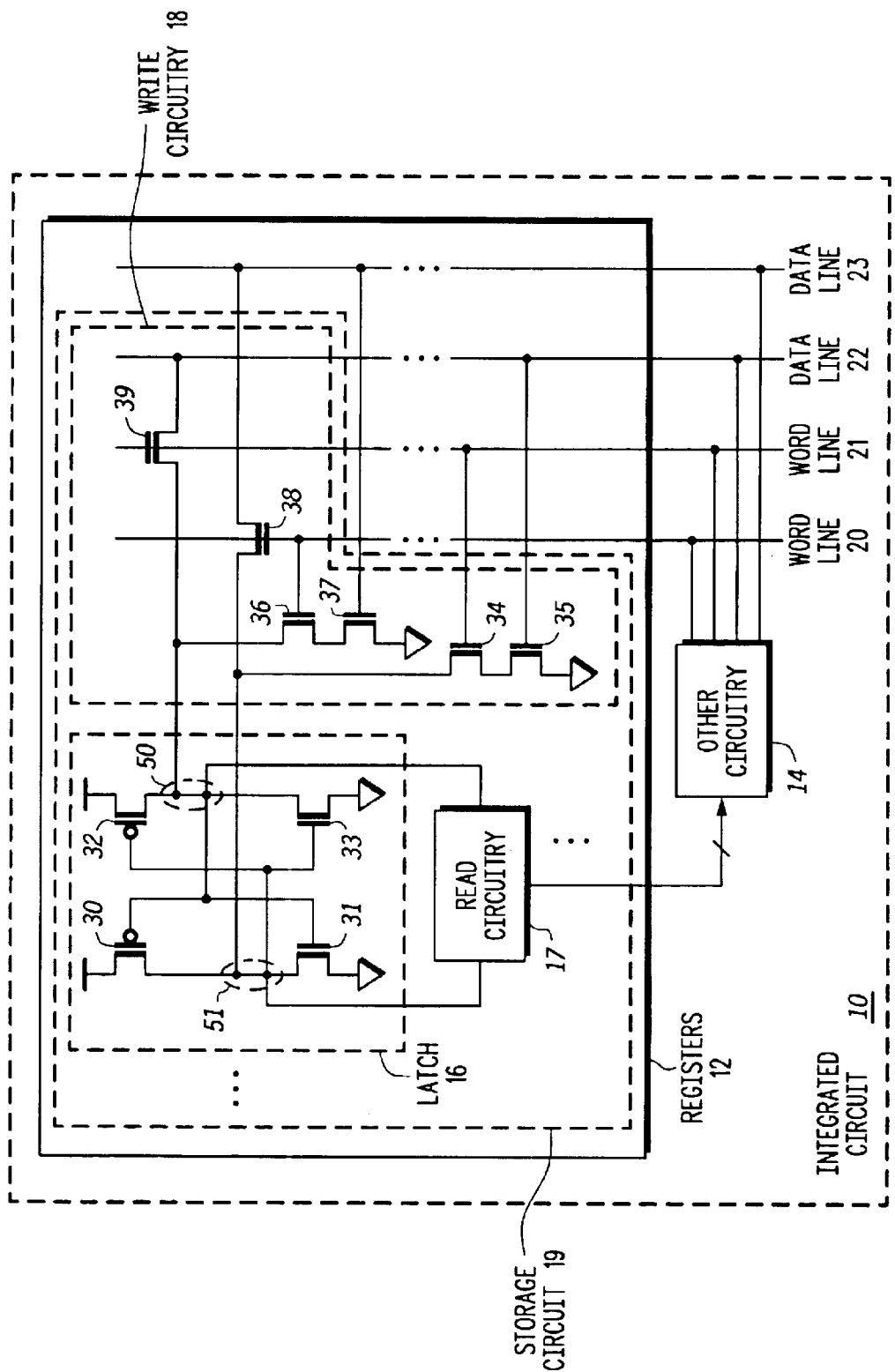
FIG. 2 illustrates, in partial schematic form and partial block diagram form, an integrated circuit 10 having a storage circuit 19 in accordance with the present invention.

FIG. 2 illustrates an integrated circuit 10 having a plurality of registers 12 and other circuitry 14. Alternate embodiments of the present invention may have only one register 12. Other circuitry 14 may include any type of circuitry, including, for example, one or more processing units, timer circuitry, communication circuitry, memory of any type, port circuitry, input/output circuitry, etc. In the illustrated embodiment, registers 12 include a plurality of storage circuits 19. Alternate embodiments of the present invention may include only one storage circuit 19. In one embodiment, storage circuit 19 includes a latch 16, write circuitry 18, and read circuitry 17, all of which are implemented using field effect transistors (FETs). Note that write circuitry 18 is single-ended because only one data line (e.g. 23) and corresponding pass device (e.g. 38) is active at one time to switch both node 50 and 51 of latch 16.

Latch 16 may be used store a bit of data in the form of a logic state "0" or a logic state "1". Note that logic states "0" and "1" are complementary. In one embodiment of the present invention, latch 16 includes a p-channel transistor 30 having a first current electrode connected to a first power supply voltage or node and having a second current electrode connected to node 51. Latch 16 also includes a p-channel transistor 32 having a first current electrode connected to the first power supply node and having a second current electrode connected to node 50. Latch 16 also includes an n-channel transistor 31 having a first current electrode connected to node 51 and a second current electrode connected to a second power supply voltage or node. Latch 16 also includes an n-channel transistor 33 having a first current electrode connected to node 50 and a second current electrode connected to the second power supply voltage node. Transistors 30 and 31 each have a control electrode connected to node 50, and transistors 32 and 33 each have a control electrode connected to node 51. In one embodiment, latch 16 is a latch having a pair of cross-coupled invertors, wherein a first invertor is formed by transistors 30 and 31, and the second invertor is formed by transistors 32 and 33.

Read circuitry 17 may be used to read the data stored in latch 16. Read circuitry 17 has a first conductor coupled to node 50 and a second conductor coupled to node 51. Read circuitry 17 is also coupled to other circuitry 14 so that the data from latch 16 may be "read" and provided to other circuitry 14. Read circuitry 17 may be implemented in any manner, including a wide variety of known prior art circuits.

Write circuitry 18 may be used to write the data that is to be latched and stored in latch 16. Write circuitry 18 includes an n-channel transistor 34 having a first current electrode coupled to node 51 and having a control electrode coupled to a word line 21. Write circuitry 18 also includes an n-channel transistor 35 having a first current electrode coupled to a second current electrode of transistor 34, having a second current electrode coupled to the second power supply node, and having a control electrode coupled to a data line 22. Write circuitry 18 also includes an n-channel transistor 36 having a first current electrode coupled to node 50 and having a control electrode coupled to a word line 20. Write circuitry 18 also includes an n-channel transistor 37 having a first current electrode coupled to a second current electrode of transistor 36, having a second current electrode coupled to the second power supply node, and having a control electrode coupled to a data line 23. Write circuitry 18 also includes an n-channel transistor 38 having a first current electrode coupled to node 51, having a second current electrode coupled to data line 23, and having a control electrode coupled to word line 20. Write circuitry 18 also includes an n-channel transistor 39 having a first current electrode coupled to node 50, having a second current electrode coupled to data line 22, and having a control electrode coupled to word line 21.

Note that in alternate embodiments of the present invention, the control electrode of transistor 34 may be coupled to data line 22 and the control electrode of transistor 35 may be coupled to word line 21. Similarly, in alternate embodiments of the present invention, the control electrode of transistor 36 may be coupled to data line 23 and the control electrode of transistor 37 may be coupled to word line 20. Note that in alternate embodiments of the present invention, additional n-channel transistors may be placed in series with transistors 34 and 35. Also, in alternate embodiments of the present invention, additional n-channel transistors may be placed in series with transistors 36 and 37.

Figure 1:
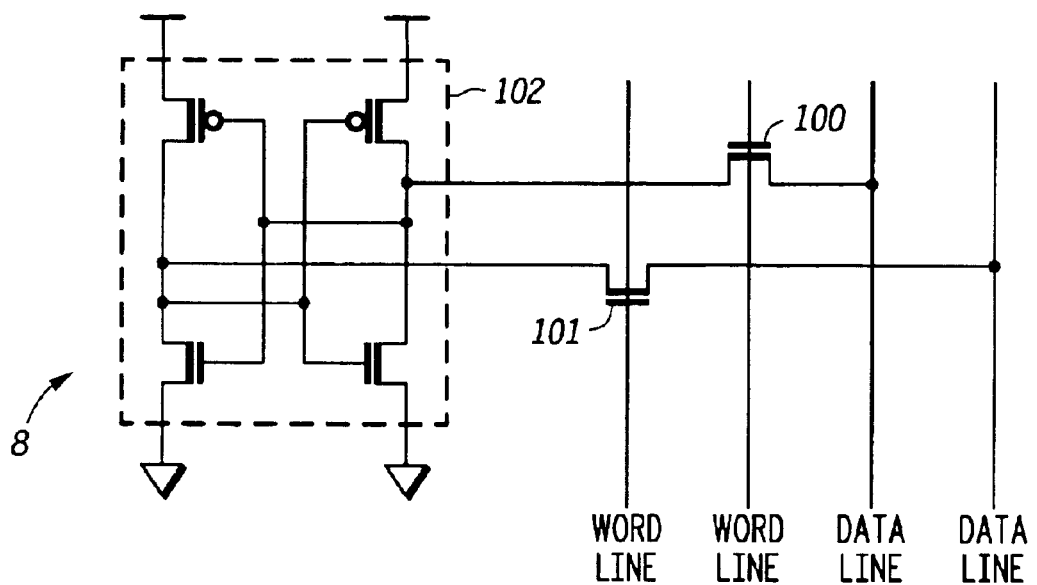
FIG. 1 illustrates, in schematic form, a storage circuit 8 having single-ended write circuitry in accordance with the prior art.

Note that word lines 20 and 21 are independent, not complementary, and function in the same manner as word lines for prior art storage circuits. Similarly, data lines 22 and 23 are independent, not complementary, and function in the same manner as data lines for prior art storage circuits. In one embodiment, the second power supply voltage is at a lower voltage than the first power supply voltage and is approximately equal to ground Referring to FIG. 1, as the physical dimensions of the devices in prior art circuit 8 are reduced, the power supply voltage must be reduced. However, to prevent the leakage currents of the devices from being too large, the threshold voltages of the transistors used in FIG. 1 are not reduced proportionately to the reduction in the power supply voltage. As a result of the comparatively high threshold voltages for the word line pass devices 100 and 101, the word line pass devices 100 and 101 are unable to satisfactorily switch a logic state "0" stored in latch 102 to a logic state "1" stored in latch 102. Either the switching is too slow, or does not occur at all.

Referring to FIG. 2, the present invention adds a transistor 35 which provides aid in transitioning node 51 from a logic state "1" to a logic state "0" when node 50 is being transitioned from a logic state "0" to a logic state "1". Note that pass transistor 39 is in source-follower mode and thus its drive capability is more impacted by the fact that its threshold voltage is has not been proportionately reduced in comparison with the power supply voltage. The drive capability of transistor 33, on the other hand, has not been impacted to the same extent because transistor 33 is not in source-follower mode (i.e. node 51 is at approximately the same voltage as the more positive power supply voltage). Thus, transistor 39 is not strong enough to overcome the effect of transistor 33; and as a result, node 50 cannot be properly driven to a logic state "1".

The present invention addresses the problem of transitioning node 50 from a logic state "0" to a logic state "1" by acting upon node 51. Note that since latch 16 is formed by cross-coupled invertors, driving node 51 to the desired state will aid in driving node 50 to the desired state. Transistor 35 acts upon node 51 by overcoming the drive of transistor 30 and pulling node 51 to a logic state "0". Note that the n-channel transistors illustrated in FIG. 2 having a stronger drive capability than the p-channel transistors of the same dimensions due to the relative mobility of holes and electrons. In some embodiments of the present invention, the effect of transistor 35 may be selectively applied to latch 16. A device, such as transistor 34, may be used to selectively negate the effect of transistor 35. When transistor 34 is conducting, transistor 35 is enabled and is used to transition node 51 from a logic state "1" to a logic state "0". When transistor 34 is non-conducting, transistor 35 is disabled and has no discernable effect on latch 16.

In a parallel manner, the present invention adds a transistor 37 which provides aid in transitioning node 50 from a logic state "1" to a logic state "0" when node 51 is being transitioned from a logic state "0" to a logic state "1". Note that pass transistor 38 is in source-follower mode and thus its drive capability is more impacted by the fact that its threshold voltage is has not been proportionately reduced in comparison with the power supply voltage. The drive capability of transistor 31, on the other hand, has not been impacted to the same extent because transistor 31 is not in source-follower mode (i.e. node 50 is at approximately the same voltage as the more positive power supply voltage). Thus, transistor 38 is not strong enough to overcome the effect of transistor 31; and as a result, node 51 cannot be properly driven to a logic state "1".

The present invention addresses the problem of transitioning node 51 from a logic state "0" to a logic state "1" by acting upon node 50. Note that since latch 16 is formed by cross-coupled invertors, driving node 50 to the desired state will aid in driving node 51 to the desired state. Transistor 37 acts upon node 50 by overcoming the drive of transistor 32 and pulling node 50 to a logic state "0". Again, note that the n-channel transistors illustrated in FIG. 2 having a stronger drive capability than the p-channel transistors of the same dimensions due to the relative mobility of holes and electrons. In some embodiments of the present invention, the effect of transistor 37 may be selectively applied to latch 16. A device, such as transistor 36, may be used to selectively negate the effect of transistor 37. When transistor 36 is conducting, transistor 37 is enabled and is used to transition node 50 from a logic state "1" to a logic state "0". When transistor 36 is non-conducting, transistor 37 is disabled and has no discernable effect on latch 16.

Note that the present invention operates in a similar manner to the prior art (see FIG. 1) in transitioning node 51 from a logic state "1" to a logic state "0" through transistor 38; and as a result, node 50 will be transitioned from a logic state "1" to a logic state "0". In addition, the present invention operates in a similar manner to the prior art (see FIG. 1) in transitioning node 50 from a logic state "1" to a logic state "0" through transistor 39; and as a result, node 51 will be transitioned from a logic state "0" to a logic state "1".

Also, note that since transistor 35 and 37 are not part of the read circuitry to read latch 16, the read access time required to read latch 16 is not affected by the present invention. Thus, the present invention does not increase the read access time, and thus does not negatively impact the performance of integrated circuit 10. Note that any small increase in the write time due to the addition of transistors 35 and 37 does not usually impact the overall performance of integrated circuit 10. This is because other circuitry 14 may move forward with other processing for write accesses to registers 12, whereas other circuitry 14 must usually wait for data when read accesses are made to registers 12.

Note also that the present invention did not require any additional data or word lines which may have increased the layout pitch of the storage circuit 19. Transistors 35 and 37 may be sized similarly to the n-channel transistors in latch 16, and thus transistors 35 and 37 may be sized very small and have little impact on the active area of storage circuit 19.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A storage circuit having single-ended write circuitry, comprising:
   a data line;
   a word line;
   a latch having a first node and a second node;
   a first transistor having a first current electrode coupled to the first node, a second current electrode coupled to the data line, and a control electrode coupled to the word line; and
   a second transistor having a first current electrode coupled to the second node, a second current electrode coupled to a power supply node, and a control electrode coupled to one of the data line or the word line.

2. The storage circuit of claim 1, wherein the first transistor and the second transistor are N-type transistors.

3. The storage circuit of claim 1, further comprising:
   a third transistor coupled between the second node and the second transistor, the third transistor having a first current electrode coupled to the second node, a second current electrode coupled to the first current electrode of the second transistor, and a control electrode coupled to another one of the data line or the word line.

4. The storage circuit of claim 3, wherein the first transistor, the second transistor, and the third transistor are N-type transistors.

5. The storage circuit of claim 1, wherein the latch comprises a pair of cross coupled inverters.

6. A memory array comprising the storage circuit of claim 1, wherein the data line is further characterized as a bit line.

7. A register comprising the storage circuit of claim 1.

8. An integrated circuit comprising the storage circuit of claim 1.

9. The storage circuit of claim 1, further comprising:
   a second word line;
   a second data line;
   a third transistor having a first current electrode coupled to the second node, a second current electrode coupled to the second data line, and a control electrode coupled to the second word line; and
   a fourth transistor having a first current electrode coupled to the first node, a second current electrode coupled to the power supply node, and a control electrode coupled to one of the second word line or the second data line.

10. The storage circuit of claim 9, wherein the data line and the second data line are independent of each other.

11. The storage circuit of claim 9, wherein the first, second, third, and fourth transistors are N-type transistors.

12. The storage circuit of claim 1, where the power supply node comprises a ground node.

13. A method of writing to a single-ended storage circuit having a latch, a data line, and a word line, comprising:
   writing a predetermined logic state via the data line and a pass device to a first node of the latch; and
   writing a complementary logic state of the predetermined logic state to a second node of the latch using a first transistor having a first current electrode coupled to the second node of the latch, a second current electrode coupled to a power supply node, and a control electrode coupled to one of the word line or the data line.

14. The method of claim 13, wherein writing the complementary logic state further comprises using a second transistor coupled between the second node of the latch and the first transistor, the second transistor having a first current electrode coupled to the second node of the latch, a second current electrode coupled to the first current electrode of the first transistor, and a control electrode coupled to another one of the word line or the data line.

15. The method of claim 14, wherein the first transistor and the second transistor are N-type transistors.

16. A storage circuit having single-ended write circuitry, comprising:
   a data line;
   a word line;
   a latch having a first node and a second node;
   a first transistor having a first current electrode coupled to the first node, a second current electrode coupled to the data line, and a control electrode coupled to the word line;
   a second transistor having a first current electrode coupled to the second node, a second current electrode, and a control electrode coupled to one of the data line or the word line; and
   a third transistor having a first current electrode coupled to the second current electrode of the second transistor, a second current electrode coupled to a power supply node, and a control electrode coupled to another one of the data line or the word line.

17. The storage circuit of claim 16, wherein the first, second, and third transistors are N-type transistors.

18. An integrated circuit comprising the storage circuit of claim 16.

19. The storage circuit of claim 16, further comprising:
   a second data line;
   a second word line;
   a fourth transistor having a first current electrode coupled to the second node, a second current electrode coupled to the second data line, and a control electrode coupled to the second word line;
   a fifth transistor having a first current electrode coupled to the first node, a second current electrode, and a control electrode coupled to one of the second data line or the second word line; and
   a sixth transistor having a first current electrode coupled to the second current electrode of the fifth transistor, a second current electrode coupled to the power supply node, and a control electrode coupled to another one of the second data line or second the word line.

20. The storage circuit of claim 19, wherein the first, second, third, fourth, fifth, and sixth transistors are N-type transistors.

21. An integrated circuit comprising the storage circuit of claim 19.

22. The storage circuit of claim 16, further comprising read circuitry coupled to the first and second nodes of the latch.

23. The storage circuit of claim 16, wherein the latch comprises:
   a first transistor having a first current electrode and a control electrode;
   a second transistor having a first current electrode coupled to the first current electrode of the first transistor and a control electrode coupled to the control electrode of the first transistor and to the second node of the latch, wherein the first current electrodes of the first and second transistors define the first node of the latch;

a third transistor having a first current electrode and a control electrode; and a fourth transistor having a first current electrode coupled to the first current electrode of the third transistor and a control electrode coupled to the control electrode of the third transistor and to the first node of the latch, wherein the first current electrodes of the third and fourth transistors define the second node of the latch.

* * * * *